US012757663B2

(12) United States Patent
Kindaichi et al.

(10) Patent No.: US 12,757,663 B2
(45) Date of Patent: Oct. 6, 2026

(54) POLISHING METHOD FOR GALLIUM NITRIDE WAFER

(71) Applicant: DISCO CORPORATION, Tokyo (JP)

(72) Inventors: Satori Kindaichi, Tokyo (JP); Ayumu Sakai, Tokyo (JP); Norihisa Arifuku, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 184 days.

(21) Appl. No.: 18/753,576

(22) Filed: Jun. 25, 2024

(65) Prior Publication Data

US 2025/0006502 A1 Jan. 2, 2025

(30) Foreign Application Priority Data

Jun. 27, 2023 (JP) ................................ 2023-104721

(51) Int. Cl.

| | |
|---|---|
| ***H10P 52/00*** | (2026.01) |
| *B24B 7/22* | (2006.01) |
| *B24B 37/005* | (2012.01) |
| *B24B 37/015* | (2012.01) |
| *B24B 37/04* | (2012.01) |
| *B24B 37/07* | (2012.01) |
| *B24B 37/10* | (2012.01) |
| *B24B 57/02* | (2006.01) |
| *H10P 52/40* | (2026.01) |

(52) U.S. Cl.

CPC .............. *H10P 52/00* (2026.01); *B24B 7/228* (2013.01); *B24B 37/0056* (2013.01); *B24B 37/015* (2013.01); *B24B 37/04* (2013.01); *B24B 37/042* (2013.01); *B24B 37/07* (2013.01); *B24B 37/10* (2013.01); *B24B 37/107* (2013.01); *B24B 57/02* (2013.01); *H10P 52/402* (2026.01); *H10P 52/403* (2026.01)

(58) Field of Classification Search

CPC ...... H10P 52/00; H10P 52/402; H10P 52/403; B24B 7/228; B24B 37/04; B24B 37/042; B24B 37/07; B24B 37/10; B24B 37/107; B24B 37/0056; B24B 37/015; B24B 57/02

USPC ............................................................ 451/28

See application file for complete search history.

(56) References Cited

U.S. PATENT DOCUMENTS

| | | | | |
|---|---|---|---|---|
| 2017/0342298 A1* | 11/2017 | Yoshida | .................. | C09G 1/04 |
| 2022/0033684 A1* | 2/2022 | Sakai | ....................... | C09G 1/04 |
| 2025/0197675 A1* | 6/2025 | Nakagai | .................. | C09G 1/02 |

FOREIGN PATENT DOCUMENTS

| | | |
|---|---|---|
| JP | 03248532 A | 11/1991 |
| JP | 2012253259 A | 12/2012 |

* cited by examiner

*Primary Examiner* — Courtney D Heinle
*Assistant Examiner* — Art Golik
(74) *Attorney, Agent, or Firm* — Greer Burns & Crain Ltd.

(57) ABSTRACT

A polishing method for a gallium nitride wafer includes a holding step of holding a first surface side of the gallium nitride wafer by a holding table, and a polishing step of polishing the gallium nitride wafer while supplying a polishing liquid to an area between a polishing pad and the gallium nitride wafer in a state in which the polishing pad is in contact with a second surface located on a side opposite to the first surface side of the gallium nitride wafer held by the holding table. The polishing liquid contains dissolved therein permanganate and a water-soluble ionic compound including one of or both nitrate ions and cerium(IV) ions.

5 Claims, 5 Drawing Sheets

POLISHING METHOD FOR GALLIUM NITRIDE WAFER

BACKGROUND OF THE INVENTION

Field of the Invention

The present invention relates to a polishing method for a gallium nitride wafer.

Description of the Related Art

In the manufacturing process of semiconductor devices, chemical mechanical polishing (CMP) has been widely adopted for imparting excellent flatness to a front surface of a silicon (Si) single crystal substrate (i.e., Si wafer). At the time of applying the CMP to the Si wafer, while a disk-shaped polishing pad and a disk-shaped chuck table holding the Si wafer thereon under suction are individually being rotated and, at the same time, slurry is being supplied to an area between the polishing pad and the Si wafer, the polishing pad is pressed against the Si wafer (see, for example, Japanese Patent Laid-open No. H3-248532).

Incidentally, as compared to the polishing rate (i.e., material removal rate or MRR) of the Si wafer, the polishing rate of such an object to be polished as a silicon carbide single crystal substrate (i.e., SiC wafer) and a gallium nitride single crystal substrate (i.e., GaN wafer) is low. In view of this, various techniques have been proposed for enhancing the polishing rate. For example, at the time of polishing the SiC wafer, the use of an acidic polishing liquid containing dissolved therein potassium permanganate and an oxidizing inorganic salt has been proposed for enhancing the polishing rate (see Japanese Patent Laid-open No. 2012-253259).

However, since the stability of the GaN single crystal is higher than the stability of the SiC single crystal, it is more difficult to polish the GaN wafer than to polish the SiC wafer. However, enhancement of the polishing rate of the GaN wafer has been demanded like that of the SiC wafer.

SUMMARY OF THE INVENTION

The present invention has been made in consideration of such a problem, and it is an object of the present invention to provide a polishing method for a GaN wafer by which it is possible to realize a comparatively high polishing rate.

In accordance with an aspect of the present invention, there is provided a polishing method for a gallium nitride wafer, including a holding step of holding a first surface side of the gallium nitride wafer by a holding table, and a polishing step of polishing the gallium nitride wafer while supplying a polishing liquid to an area between a polishing pad and the gallium nitride wafer in a state in which the polishing pad is in contact with a second surface located on a side opposite to the first surface side of the gallium nitride wafer held by the holding table. The polishing liquid contains dissolved therein permanganate and a water-soluble ionic compound including one of or both nitrate ions and cerium(IV) ions.

Preferably, the permanganate is sodium permanganate, and the water-soluble ionic compound is diammonium cerium(IV) nitrate.

In the polishing method for a gallium nitride wafer according to the aspect of the present invention, the gallium nitride wafer is polished while a polishing liquid containing dissolved therein permanganate and a water-soluble ionic compound including one of or both nitrate ions and cerium (IV) ions is being supplied to an area between a polishing pad and the gallium nitride wafer. As a result, a high polishing rate can be realized, as compared to the case of polishing the gallium nitride wafer while supplying a polishing liquid containing dissolved therein permanganate but not containing dissolved therein the above-mentioned water-soluble ionic compound to the area between the polishing pad and the gallium nitride wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
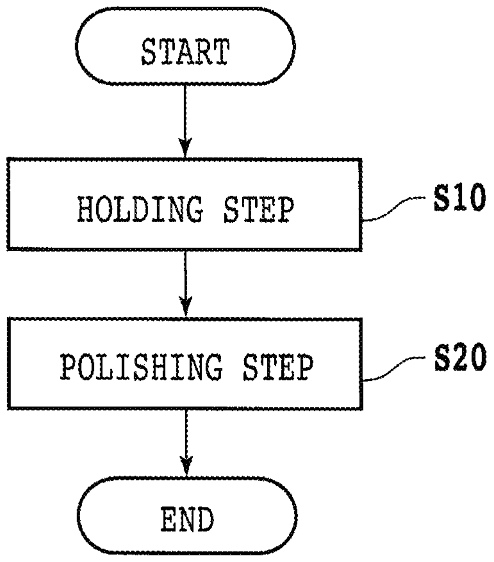
FIG. 1 is a flow chart depicting a polishing method for a GaN wafer according to an embodiment of the present invention.

An embodiment according to an aspect of the present invention will be described below with reference to the attached drawings. FIG. 1 is a flow chart depicting a polishing method for a gallium nitride wafer (GaN wafer) 11 (see FIG. 2) according to the present embodiment. In the polishing method, a holding step S10 and a polishing step S20 are carried out sequentially. First, a polishing liquid 13 (see FIG. 3) used in the polishing step S20 of the present embodiment will be described.

The polishing liquid 13 includes an aqueous solution in which permanganate and a water-soluble ionic compound are dissolved. As the permanganate, sodium permanganate ($NaMnO_4$), potassium permanganate ($KMnO_4$), or the like is used. The permanganate in the aqueous solution is ionized into metallic cations and permanganate ions ($MnO_4^-$).

The permanganate ions function as an oxidant for oxidizing the GaN wafer 11. Since sodium permanganate is higher than potassium permanganate in solubility in water, it is preferable to use sodium permanganate, which is comparatively high in solubility in water, for enhancing the effect of the permanganate ions as an oxidant.

The above-mentioned water-soluble ionic compound (i) includes both nitrate ions and cerium(IV) ions, (ii) includes nitrate ions but does not include cerium(IV) ions, or (iii) does not include nitrate ions but includes cerium(IV) ions.

Note that cerium(IV) ions mean tetravalent cations of cerium (i.e., $Ce^{4+}$). Cerium(IV) ions function as a strong oxidant, unlike cerium(III) ions which are trivalent cations of cerium (i.e., $Ce^{3+}$). The nitrate ions ($NO_3^-$) also function as a strong oxidant.

(i) Examples of the water-soluble ionic compound including both nitrate ions and cerium(IV) ions include diammonium cerium(IV) nitrate (i.e., $Ce(NH_4)_2(NO_3)_6$).

(ii) Examples of the water-soluble ionic compound including nitrate ions but not including cerium(IV) ions include cerous nitrate, which is also referred as cerium(III) nitrate (i.e., $Ce(NO_3)_3$), and ammonium nitrate (i.e., $NH_4NO_3$).

(iii) Examples of the water-soluble ionic compound which does not include nitrate ions but includes cerium(IV) ions include ammonium cerium(IV) sulfate (i.e., $Ce(NH_4)_4(SO_4)_4$) and cerium(IV) sulfate (i.e., $Ce(SO_4)_2$).

Due to the permanganate and the above-mentioned water-soluble ionic compound, the polishing liquid 13 is strongly acidic (for example, having a pH of a predetermined value less than 3). Note that the polishing liquid 13 may further contain additives such as a pH adjuster, a viscosity adjuster, a rust-preventive agent, and an antiseptic, and free abrasive grains (for example, abrasive grains made of silica ($SiO_2$)).

The GaN wafer 11 in the present embodiment to be polished by use of the polishing liquid 13 is what is generally called a self-standing type wafer formed of a GaN single crystal substrate. However, it is sufficient if the GaN wafer 11 is any wafer in which a region to be polished is a GaN single crystal layer. In other words, the GaN wafer 11 may be what is generally called an epitaxial wafer that has a base substrate such as a sapphire wafer or a Si wafer and a GaN epitaxial growth layer formed on the base substrate. A lattice matching layer may be provided between the base substrate and the epitaxial growth layer.

Next, a mechanism at the time of subjecting the GaN wafer 11 to chemical mechanical polishing by use of the polishing liquid 13 will be described. Note that the mechanism described below is a presumption by the present inventor at the time of filing the patent application, and the actual mechanism may differ therefrom.

First, when the polishing liquid 13 is supplied to a front surface 11*a* (see FIG. 2) of the GaN wafer 11, due to an oxidizing action of permanganate ions ($MnO_4^-$) as well as nitrate ions ($NO_3^-$) and/or cerium(IV) ions ($Ce^{4+}$), Ga atoms on the front surface 11*a* side are oxidized, and a gallium oxide (for example, $Ga_2O_3$) layer is formed.

In this instance, N atoms constituting the GaN on the front surface 11*a* are converted into a nitrogen oxide (NOx), which is, for example, discharged to the outside of the polishing liquid 13 in the form of gas, or is discharged to the outside of the GaN wafer 11 together with the polishing liquid 13.

The gallium oxide layer formed on the front surface 11*a* is softer than the single crystal of GaN. The gallium oxide layer is physically ground off by abrasive grains, whereby a new crystal surface of GaN is exposed. In this way, the formation of the gallium oxide layer by the oxidizing action and the physical grinding off of the gallium oxide layer by the abrasive grains are alternately repeated.

Hence, in the chemical mechanical polishing, the balance between the formation rate at which an oxide film is formed and the removal rate at which the oxide film is removed is important. In addition, the single crystal of GaN and the single crystal of SiC are different from each other in the formation rate and the removal rate, even when the same polishing liquid 13 is used for them; hence, processing conditions for chemical mechanical polishing which is applicable to the single crystal of SiC cannot necessarily be applied as they are as processing conditions for chemical mechanical polishing of the single crystal of GaN. Besides, since the single crystal of GaN is in general chemically more stable than the single crystal of SiC, it is more difficult for the chemical mechanical polishing to be applied to the single crystal of GaN than to the single crystal of SiC.

Japanese Patent Laid-open No. 2012-253259 mentioned above states that, in the chemical mechanical polishing of the single crystal of SiC, the use of ammonium cerium nitrate as an oxidizing inorganic salt promises a highest polishing rate. However, according to the present applicant's further research conducted thereafter, it has been found that, in the chemical mechanical polishing of the single crystal of SiC, the polishing rate can be made higher by use of lanthanum nitrate than by use of ammonium cerium nitrate. It is considered that this is because, in the case of using ammonium cerium nitrate, the formation rate of the oxide film in the single crystal of SiC is too higher than the removal rate of the oxide film, and, hence, the chemical mechanical polishing is limited by the removal rate of the oxide film.

Meanwhile, in the case of using lanthanum nitrate in the chemical mechanical polishing of the single crystal of SiC, the formation rate of the oxide film and the removal rate of the oxide film are balanced with each other, and, hence, the polishing rate can be made high as compared to the case of using ammonium cerium nitrate.

However, in the chemical mechanical polishing of the single crystal of GaN, in the case of using lanthanum nitrate, the formation of the oxide film does not catch up with the removal of the oxide film, and, hence, the polishing rate is low as compared to the case of using ammonium cerium nitrate. In other words, in the chemical mechanical polishing of the single crystal of GaN, in the case of using ammonium cerium nitrate, the formation rate of the oxide film and the removal rate of the oxide film are balanced with each other, and, hence, the polishing rate can be made high as compared to the case of using lanthanum nitrate.

In this way, attention should be paid to the fact that, although the single crystal of SiC and the single crystal of GaN are both compound semiconductors having a hexagonal crystal structure, the knowledge concerning the chemical mechanical polishing of the single crystal of SiC cannot always be applied as it is to the chemical mechanical polishing of the single crystal of GaN.

Figure 3:
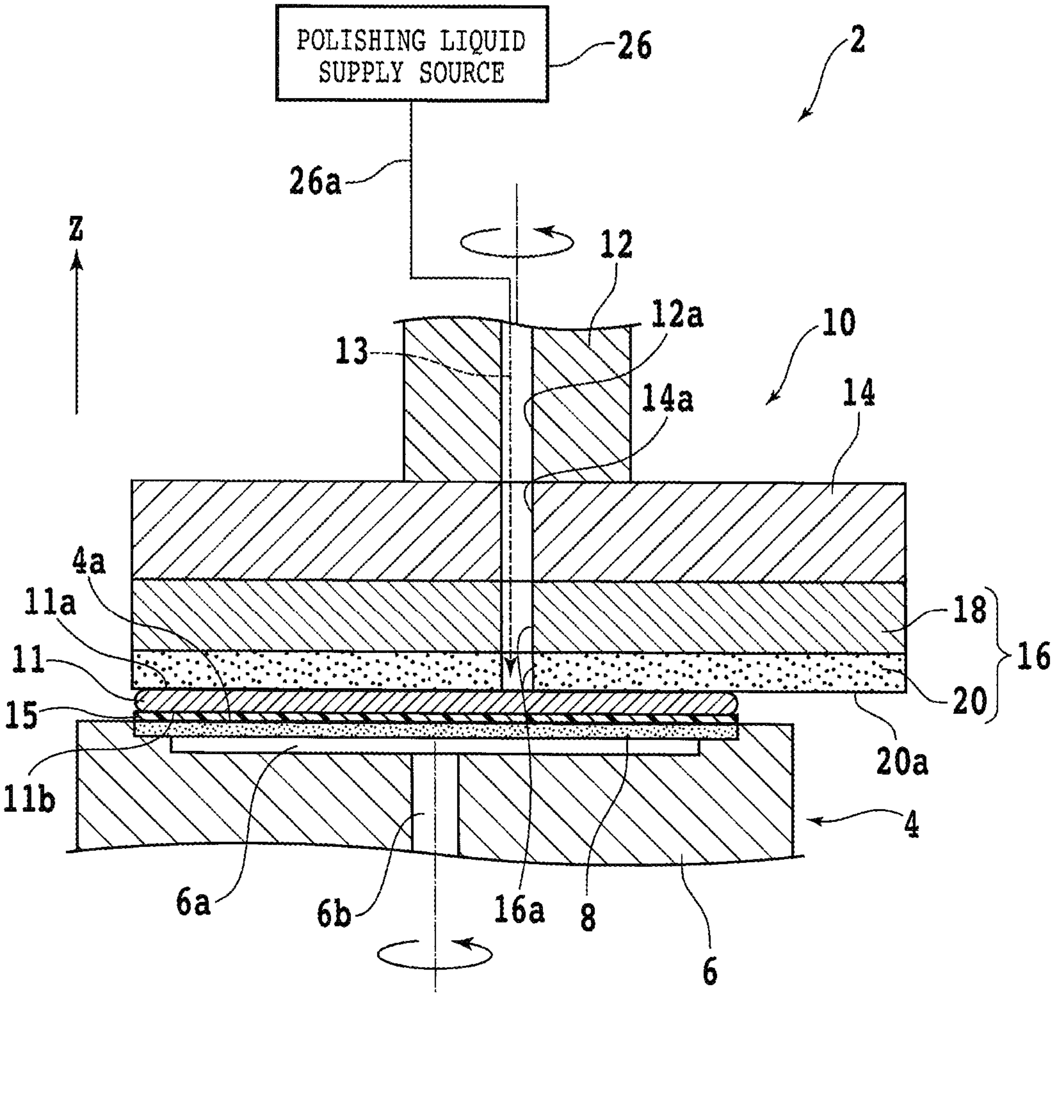
FIG. 3 is a diagram depicting a polishing step in the polishing method.

Next, a polishing apparatus 2 for polishing the GaN wafer 11 will be described with reference to FIG. 3. Note that a Z-axis direction indicated in FIG. 3 is substantially parallel to a vertical direction. The polishing apparatus 2 has a disk-shaped chuck table (holding table) 4.

A rotary shaft (not illustrated) of which the longitudinal direction is disposed along the Z-axis direction is coupled to a lower surface side of the chuck table 4. A driven pulley (not illustrated) is fixed to a lower end part of the rotary shaft. A rotational drive source (not illustrated) such as a motor is provided in the vicinity of the chuck table 4. A driving pulley (not illustrated) is provided on an output shaft of the rotational drive source. An endless belt (not illustrated) is wrapped around the driving pulley and the driven pulley. When the rotational drive source is actuated, power of the rotational drive source is transmitted to the rotary shaft of the chuck table 4, and the chuck table 4 is rotated around the rotary shaft.

The chuck table 4, the rotational drive source, and the like are supported by a moving plate (not illustrated) which is movable in a predetermined direction (for example, an X-axis direction orthogonal to the Z-axis direction). The moving plate is movable along the X-axis direction together with the chuck table 4, the rotational drive source, and the like by a ball screw type moving mechanism (not illustrated). The chuck table 4 has a disk-shaped frame body 6 formed of a dense ceramic that does not have a three-dimensional mesh-like porous structure. An upper part of the frame body 6 is formed with a disk-shaped recess. A disk-shaped porous plate 8 formed of a porous ceramic or the like that has a three-dimensional mesh-like porous structure is fixed in the recess.

An upper surface of the porous plate 8 and an upper surface of the frame body 6 are flush with each other and form a substantially flat holding surface 4*a*. The porous plate 8 is connected to a suction source (not illustrated) such as a vacuum pump through channels 6*a* and 6*b* formed inside the frame body 6. When the suction source is actuated, a negative pressure is transmitted to the upper surface of the porous plate 8. The GaN wafer 11 is placed on the holding surface 4*a*. A circular protective tape 15 formed of resin is stuck to a back surface 11*b* of the GaN wafer 11 depicted in FIG. 3, for the purpose of preventing contamination, shock, or the like of or on the GaN wafer 11.

When the back surface 11*b* side is held under suction by the holding surface 4*a* with the protective tape 15 therebetween, the front surface 11*a* of the GaN wafer 11 that is located on the side opposite to the back surface 11*b* is directed upward. A polishing unit 10 is disposed above the holding surface 4*a*. The polishing unit 10 has a cylindrical spindle housing (not illustrated). The longitudinal direction of the spindle housing is disposed substantially in parallel to the Z-axis direction. A ball screw type Z-axis direction moving unit (not illustrated) for moving the polishing unit 10 in the Z-axis direction is coupled to the spindle housing.

A part of a cylindrical spindle 12 is rotatably accommodated inside the spindle housing. The longitudinal direction of the spindle 12 is disposed substantially in parallel to the Z-axis direction. A rotational drive source (not illustrated) such as a servo motor for rotating the spindle 12 is provided in the vicinity of an upper end part of the spindle 12. A central part of an upper surface of a disk-shaped mount 14 is coupled to a lower end part of the spindle 12. The mount 14 has a diameter greater than the diameter of the holding surface 4*a*. A disk-shaped polishing tool 16 having substantially the same diameter as that of the mount 14 is mounted to a lower surface of the mount 14.

The polishing tool 16 has a disk-shaped base 18 coupled to the lower surface of the mount 14. The base 18 is formed of metal such as stainless steel. A polishing pad 20 having substantially the same diameter as that of the base 18 is fixed to a lower surface of the base 18. The polishing pad 20 has a main body section formed of foamed urethane resin. The foamed urethane resin can be manufactured by mixing a polyfunctional isocyanate, a polyfunctional polyol, a foaming agent, a catalyst, and the like.

The polyfunctional isocyanate is, for example, tolylene diisocyanate (TDI), 4,4-diphenylmethane diisocyanate (MDI), or the like. The polyfunctional polyol includes polyether polyols, polyester polyols, and polymer polyols, though the specific material names are omitted. As the foaming agent, there is used, for example, water. Note that a flon-based compound such as hydrofluorocarbon and hydrofluoroolefin may be used in place of water. As the catalyst, there is used an amine compound such as triethylenediamine, a metallic compound, or the like. By appropriately adjusting the amounts of the polyfunctional isocyanate, the polyfunctional polyol, the foaming agent, the catalyst, and the like, the expansion ratio of polyurethane is adjusted to not less than one and not more than three. Note that, in place of the foamed urethane resin, another kind of foamed resin or a nonwoven fabric may be used for the main body section of the polishing pad 20.

In the main body section of the polishing pad 20, abrasive grains made of silica are fixed. In other words, the polishing pad 20 is what is generally called a fixed abrasive grain pad. The content of the abrasive grains is preferably set to be not less than 5 vol % and not more than 70 vol % (for example, 30 vol %). Note that the abrasive grains may not be fixed in the polishing pad 20. In this case, free abrasive grains are dispersed in the polishing liquid 13.

Center positions in the radial direction of the polishing tool 16, the mount 14, and the spindle 12 are substantially coincident. The polishing tool 16 is formed at the center in the radial direction thereof with a cylindrical through-hole 16*a*, the mount 14 is formed at the center in the radial direction thereof with a cylindrical through-hole 14*a*, and the spindle 12 is formed at the center in the radial direction thereof with a cylindrical through-hole 12*a*. The through-holes 16*a*, 14*a*, and 12*a* constitute one channel. A polishing liquid supply source 26 is connected to an upper end part of the channel through a conduit 26*a*. The polishing liquid supply source 26 includes a reservoir tank (not illustrated) for the polishing liquid 13, a pump (not illustrated) for feeding the polishing liquid 13 from the reservoir tank into the conduit 26*a*, and the like.

The polishing liquid 13 supplied from the polishing liquid supply source 26 is supplied to the polishing pad 20 and the GaN wafer 11 held by the holding surface 4*a*, through the through-holes 16*a*, 14*a*, and 12*a*. Next, the holding step S10 and the polishing step S20 will be described sequentially.

Figure 2:
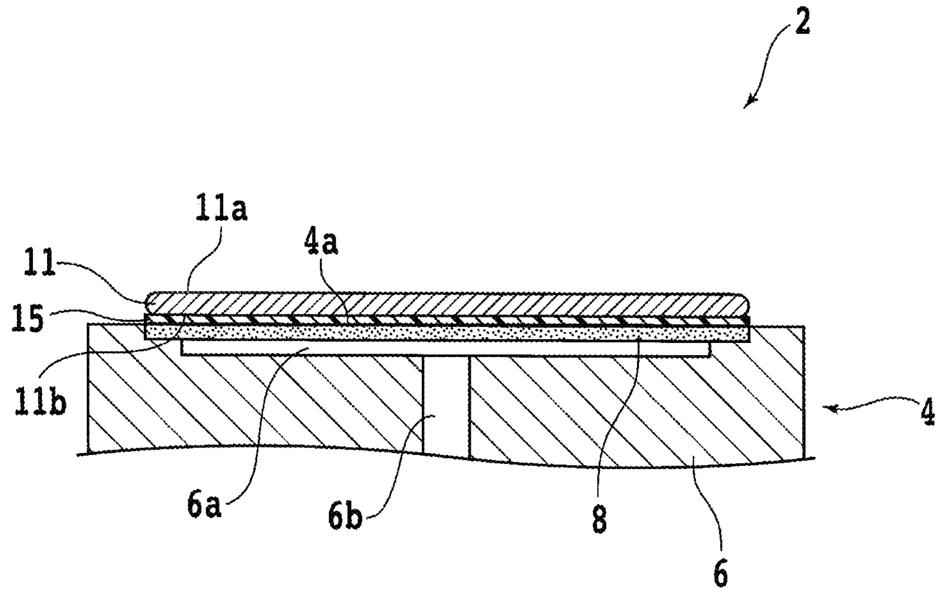
FIG. 2 is a diagram depicting a holding step in the polishing method.

FIG. 2 is a diagram depicting the holding step S10. As depicted in FIG. 2, the chuck table 4 is disposed at a position different from a position directly under the polishing unit 10, and, in this state, the back surface (first surface) 11*b* side of the GaN wafer 11 is held under suction by the holding surface 4*a* of the chuck table 4 with the protective tape 15 therebetween (holding step S10). In this instance, the front surface (second surface) 11*a* of the GaN wafer 11 is exposed in the state of being directed upward.

FIG. 3 is a diagram depicting the polishing step S20 performed after the holding step S10. In the polishing step S20, the chuck table 4 is rotated in a predetermined direction, and the spindle 12, the mount 14, and the polishing tool 16 are rotated in a predetermined direction. In this instance, the polishing liquid 13 is supplied from the polishing liquid supply source 26. Further, in a state in which a lower surface 20*a* of the polishing pad 20 is in contact with the front surface 11*a* of the GaN wafer 11, the polishing pad 20 is pressed against the GaN wafer 11 with a predetermined pressure while the polishing liquid 13 is being supplied to an area between the polishing pad 20 and the front surface 11*a* of the GaN wafer 11.

In this way, as a result of the rotations of the chuck table 4 and the polishing pad 20, the supply of the polishing liquid 13, and the pressing of the polishing pad 20 against the GaN wafer 11, the front surface 11*a* side is polished according to the above-described mechanism of chemical mechanical polishing.

Note that, in the present embodiment, the surface to be ground (front surface 11*a*) is directed upward (i.e., face-up), and the polishing liquid 13 is supplied to the surface to be ground from above the surface to be ground. Hence, the amount of the polishing liquid 13 scattered to the outside of the polishing pad 20 by a centrifugal force can be reduced. More specifically, in the present embodiment, the amount of the polishing liquid 13 scattered to the outside of the polishing pad 20 by the centrifugal force can be reduced, as compared to the case where the surface to be ground is directed downward (i.e., face-down), and where the polishing liquid 13 is supplied to that region of the polishing pad 20 which does not overlap the surface to be ground, from above the polishing pad 20.

First Experimental Example

Next, a first experimental example in which a self-standing type GaN wafer 11 having a diameter of 2 inches (approximately 50.8 mm) was polished by use of polishing liquids #1 to #6 (see Table 1 below) will be described. In Table 1, the configurations of the polishing liquids #1 to #6 and the polishing rates (MRR) are set forth. The configuration of the polishing liquid is described in separate terms of a first component (permanganate) and a second component (nitrate ions and/or cerium(IV) ions). Note that, as to the first component, the first digit after the decimal point is rounded off, and, as to the second component, the second digit after the decimal point is rounded off.

TABLE 1

| Polishing liquid | First component [conc.: wt %] | Second component [conc.: wt %] | MRR (μm/h) |
|---|---|---|---|
| #1 | $NaMnO_4$ [2] | $Ce(NH_4)_2(NO_3)_6$ [0.5] | 0.366 |
| #2 | $NaMnO_4$ [2] | $Ce(NO_3)_3$ [0.5] | 0.009 |
| #3 | $NaMnO_4$ [2] | nil | 0.000 |
| #4 | nil | $Ce(NH_4)_2(NO_3)_6$ [0.5] | 0.171 |
| #5 | nil | $NH_4NO_3$ [0.4] | 0.014 |
| #6 | nil | $Ce(NH_4)_4(SO_4)_4$ [0.5] | 0.000 |

Next, the methods of preparing the polishing liquids #1 to #6 will be described.

(Polishing Liquid #1)

Diammonium cerium(IV) nitrate in an amount of 22.5 g was added to a sufficient amount (less than 5 L) of pure water, 120 g of sodium permanganate was further added thereto, then the resulting solution was diluted with pure water to 5 L, and thereafter the diluted solution was stirred by use of a stirrer at 100 rpm for 30 minutes, to prepare 5 L of a polishing liquid that contained dissolved therein 2.4 wt % of sodium permanganate and 0.45 wt % of diammonium cerium(IV) nitrate.

(Polishing Liquid #2)

Cerium(III) nitrate in an amount of 22.5 g was added to a sufficient amount (less than 5 L) of pure water, 120 g of sodium permanganate was further added thereto, then the resulting solution was diluted with pure water to 5 L, and thereafter the diluted solution was stirred by use of a stirrer at 100 rpm for 30 minutes, to prepare 5 L of a polishing liquid that contained dissolved therein 2.4 wt % of sodium permanganate and 0.45 wt % of cerium(III) nitrate.

(Polishing Liquid #3)

Sodium permanganate in an amount of 120 g was added to 5 L of pure water, and thereafter the resulting solution was stirred by use of a stirrer at 100 rpm for 30 minutes, to prepare 5 L of a polishing liquid that contained dissolved therein 2.4 wt % of sodium permanganate.

(Polishing Liquid #4)

Diammonium cerium(IV) nitrate in an amount of 22.5 g was added to 5 L of pure water, and thereafter the resulting solution was stirred by use of a stirrer at 100 rpm for 30 minutes, to prepare 5 L of a polishing liquid that contained dissolved therein 0.45 wt % of diammonium cerium(IV) nitrate.

(Polishing Liquid #5)

Ammonium nitrate in an amount of 20 g was added to 5 L of pure water, and thereafter the resulting solution was stirred by use of a stirrer at 100 rpm for 30 minutes, to prepare 5 L of a polishing liquid that contained dissolved therein 0.40 wt % of ammonium nitrate.

(Polishing Liquid #6)

Ammonium cerium(IV) sulfate in an amount of 26 g was added to 5 L of pure water, and thereafter the resulting solution was stirred by use of a stirrer at 100 rpm for 30 minutes, to prepare 5 L of a polishing liquid that contained dissolved therein 0.52 wt % of ammonium cerium(IV) sulfate.

The polishing conditions for polishing the GaN wafer 11 were the same except that the configurations of the polishing liquids were different. The details of the polishing conditions are as follows.

Rotating speed of chuck table: 100 rpm

Rotating speed of polishing pad: 100 rpm

Diameter of polishing pad: 200 mm

Flow rate of polishing liquid: 20 ml/min

Polishing time: 90 min

Surface to be polished: Ga surface (i.e., (0001) surface)

Pressure against surface to be polished: 0.2 Mpa

As is clear from the polishing rates set forth in Table 1, the polishing rate is the highest in the case of using the polishing liquid #1 containing the permanganate ions and both the nitrate ions and the cerium(IV) ions. In addition, the polishing rate is the second highest in the case of using the polishing liquid #4 not containing the permanganate ions but containing both the nitrate ions and the cerium(IV) ions. It is to be noted, however, that the polishing rate in the case of using the polishing liquid #4 is approximately one half of the polishing rate in the case of using the polishing liquid #1.

Besides, the polishing rate in the case of using the polishing liquid #5 not containing the permanganate ions and containing the nitrate ions but not containing the cerium (IV) ions and the polishing rate in the case of using the polishing liquid #2 containing the permanganate ions and containing the nitrate ions but not containing the cerium(IV) ions are substantially the same, but the polishing rates in these cases are approximately 1/10 times the polishing rate in the case of using the polishing liquid #4.

In the case of using the polishing liquid #3 containing the permanganate ions but containing neither the nitrate ions nor the cerium(IV) ions and in the case of using the polishing liquid #6 not containing the permanganate ions and not containing the nitrate ions but containing the cerium(IV) ions, polishing of the GaN wafer 11 is substantially impossible. In other words, in consideration of the results of the polishing rates in the cases of using the polishing liquids #3 and #6, it can be said that, although both the permanganate ions and the cerium(IV) ions are in general strong oxidants, if each of them is used singly, the single use is unsuitable for the CMP of the GaN wafer 11.

In the present embodiment, the GaN wafer 11 is polished while supplying the polishing liquid 13 containing dissolved therein the permanganate and the water-soluble ionic compound that includes either one of or both the nitrate ions and the cerium(IV) ions to the area between the polishing pad 20 and the GaN wafer 11. As a result, a high polishing rate can be realized, as compared to the case where the GaN wafer 11 is polished while supplying the polishing liquid containing dissolved therein the permanganate but not containing dissolved therein the above-mentioned wafer-soluble ionic compound to the area between the polishing pad 20 and the GaN wafer 11. Particularly, in the case of using the polishing liquid #1 containing dissolved therein the permanganate and the water-soluble ionic compound including both the nitrate ions and the cerium(IV) ions, a very high polishing rate can be realized owing to a synergistic effect of the permanganate ions, the nitrate ions, and the cerium(IV) ions, and the thus realized polishing rate is higher than the polishing rate in the case of using each of these ions singly and the polishing rate in the case of using a combination of any two of these ions.

Second Experimental Example

Next, description will be made of a second experimental example in which a GaN wafer 11 (note that the GaN wafer 11 is an epitaxial wafer in which an epitaxial growth layer of GaN is formed on a sapphire wafer) having a diameter of 4 inches (approximately 100 mm) was polished by use of polishing liquids #7 and #8 (see Table 2 below). Note that, as to the first component, the first digit after the decimal point is rounded off, as to the second component, the second digit after the decimal point is rounded off, and, as to the polishing rate, the fourth digit after the decimal point is rounded off.

TABLE 2

| Polishing liquid | First component [conc.: wt %] | Second component [conc.: wt %] | MRR (μm/h) |
|---|---|---|---|
| #7 | $NaMnO_4$ [2] | $La(NO_3)_3$ [1.2] | 0.021 |
| #8 | $NaMnO_4$ [2] | $Ce(NH_4)_2(NO_3)_6$ [0.3] | 0.035 |
| #9 | $NaMnO_4$ [2] | $Ce(NH_4)_2(NO_3)_6$ [0.6] | 0.058 |
| #10 | $NaMnO_4$ [2] | $Ce(NH_4)_2(NO_3)_6$ [0.9] | 0.046 |

(Polishing Liquid #7)

Lanthanum nitrate in an amount of 60 g was added to a sufficient amount (less than 5 L) of pure water, 120 g of sodium permanganate was further added thereto, then the resulting solution was diluted with pure water to 5 L, and thereafter the diluted solution was stirred by use of a stirrer at 100 rpm for 30 minutes, to prepare 5 L of a polishing liquid that contained dissolved therein 2.4 wt % of sodium permanganate and 1.2 wt % of lanthanum nitrate.

(Polishing Liquid #8)

Diammonium cerium(IV) nitrate in an amount of 15 g was added to a sufficient amount (less than 5 L) of pure water, 120 g of sodium permanganate was further added thereto, then the resulting solution was diluted with pure water to 5 L, and thereafter the diluted solution was stirred by use of a stirrer at 100 rpm for 30 minutes, to prepare 5 L of a polishing liquid that contained dissolved therein 2.4 wt % of sodium permanganate and 0.3 wt % of diammonium cerium(IV) nitrate.

Since the molecular weight of lanthanum nitrate is approximately 433 g, the number of moles of $La(NO_3)_3$ in the polishing liquid #7 is approximately 0.139 (=60/433). Hence, the number of moles of the nitrate ions is approximately 0.416 (=60×3/433). On the other hand, since the molecular weight of diammonium cerium(IV) nitrate is approximately 548 g, the number of moles of $Ce(NH_4)_2(NO_3)_6$ in the polishing liquid #8 is approximately 0.027 (=15/548). In other words, the number of moles of the cerium(IV) ions is approximately 0.027, and the number of moles of the nitrate ions is approximately 0.164 (=15×6/548). Hence, the number of moles of the component that can function as an oxidant is approximately 0.192.

In this way, although the polishing liquid #7 is approximately two times the polishing liquid #8 in the number of moles of the component that can function as an oxidant, the polishing rate in the case of using the polishing liquid #8 is approximately 1.7 (=0.035/0.021) times the polishing rate in the case of using the polishing liquid #7. In other words, the advantage of using the polishing liquid containing the permanganate ions and both the nitrate ions and the cerium(IV) ions as a polishing liquid for the GaN wafer 11 has been made clear.

(First Modification)

Figure 4:
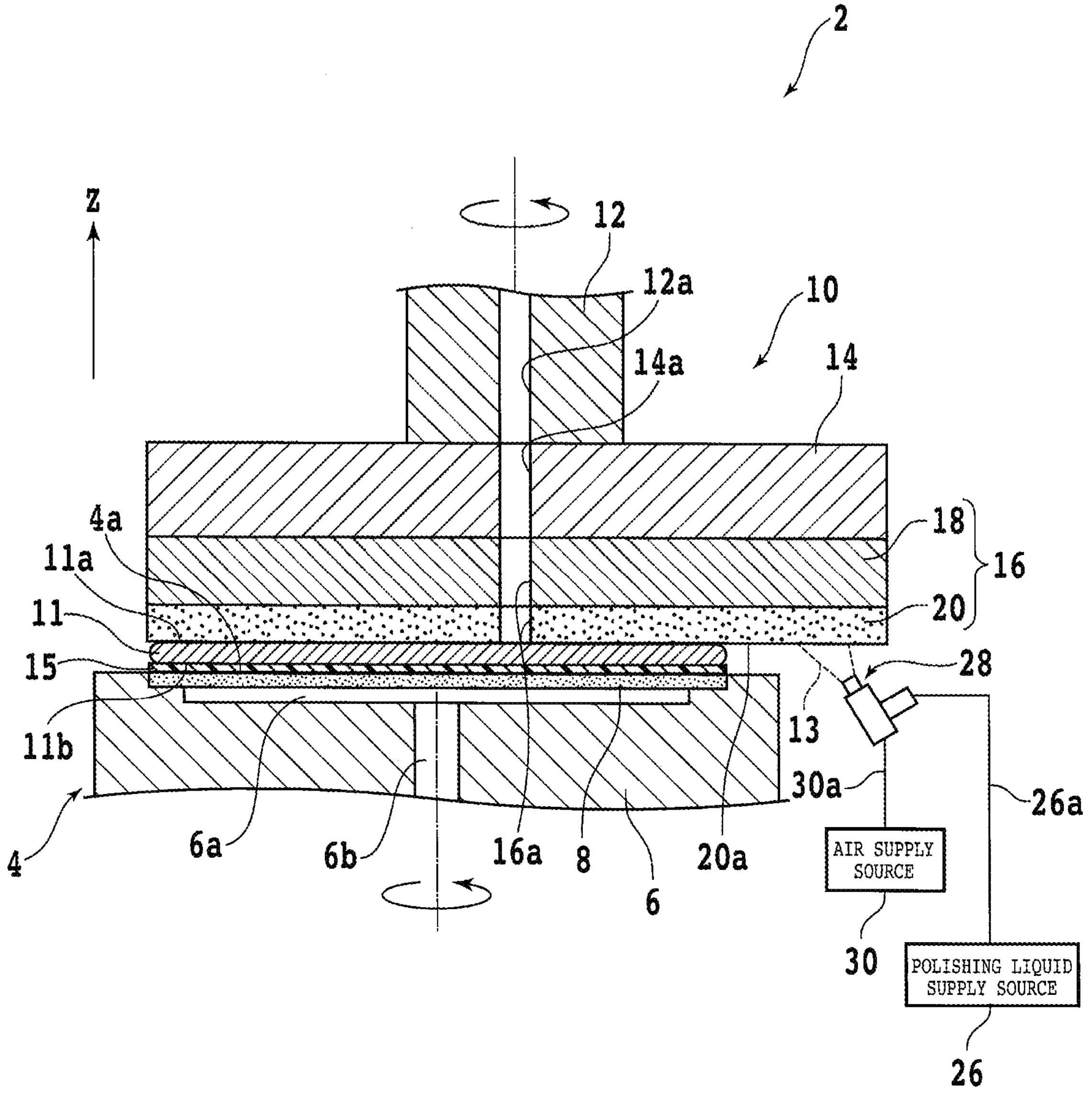
FIG. 4 is a diagram depicting a first modification of the polishing step.

Next, a first modification of the polishing step S20 will be described with reference to FIG. 4. FIG. 4 is a diagram depicting the first modification of the polishing step S20. In a polishing apparatus 2 of the first modification, the polishing liquid 13 is supplied from a nozzle 28 disposed below the polishing pad 20 to the polishing pad 20, in place of supplying the polishing liquid 13 through the through-hole 16*a* of the polishing tool 16. To the nozzle 28, the polishing liquid supply source 26 is connected through the above-mentioned conduit 26*a*, and an air supply source 30 is connected through a conduit 30*a*. The air supply source 30 includes a compressor (not illustrated), a tank (not illustrated) for reserving compressed air, and the like.

In the polishing step S20, the polishing liquid 13 and air are mixed in the nozzle 28 to be a mist, and the mist-form polishing liquid 13 is jetted from the nozzle 28 to the lower surface 20*a* of the polishing pad 20. Particularly, the mist-form polishing liquid 13 is jetted to that region of the lower surface 20*a* of the polishing pad 20 which is different from the overlapping region of the polishing pad 20 and the GaN wafer 11.

(Second Modification)

Figure 5:
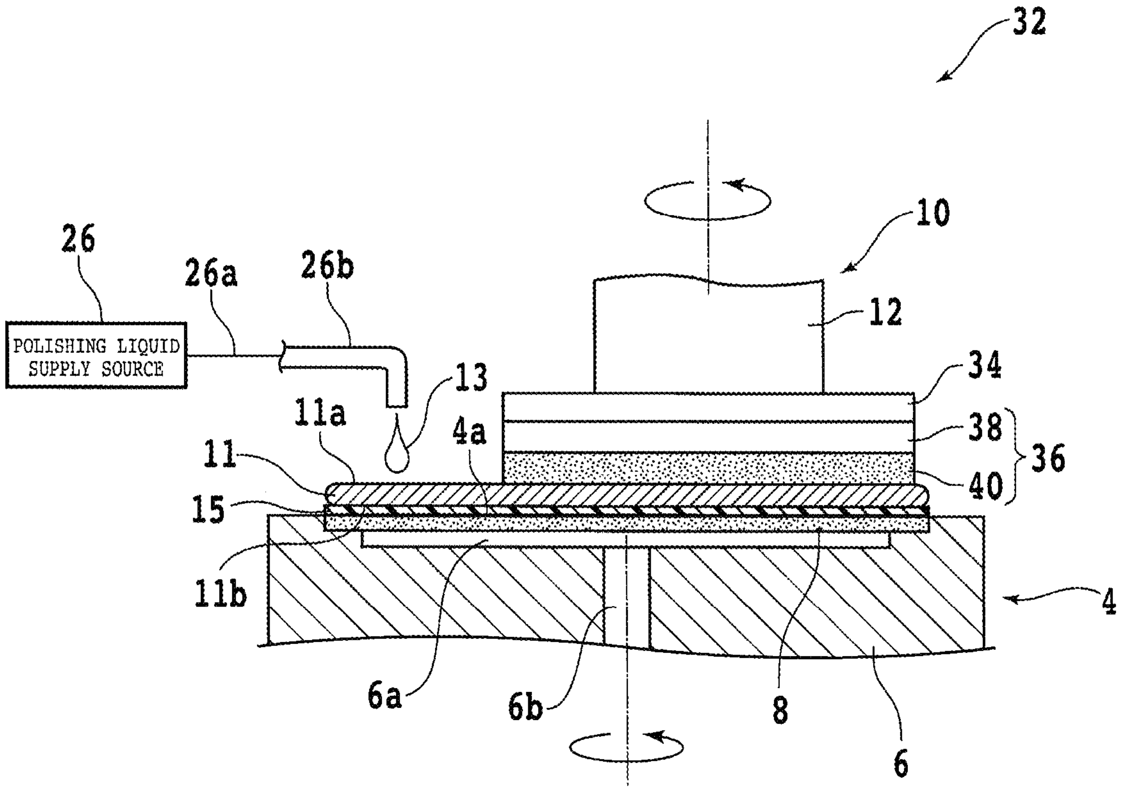
FIG. 5 is a diagram depicting a second modification of the polishing step.

Next, a second modification of the polishing step S20 will be described with reference to FIG. 5. FIG. 5 is a diagram depicting the second modification of the polishing step S20. A polishing apparatus 32 of the second modification has a mount 34 having a diameter smaller than the diameter of the holding surface 4*a*. To a lower surface side of the mount 34, a polishing tool 36 substantially the same as the mount 34 in diameter is mounted. The polishing tool 36 has a disk-shaped base 38 coupled to the lower surface of the mount 34. To a lower surface of the base 38, a polishing pad 40 substantially the same as the base 38 in diameter is fixed. Above the holding surface 4*a*, a nozzle 26*b* is provided. The nozzle 26*b* is connected to the polishing liquid supply source 26 through the above-mentioned conduit 26*a*. The nozzle 26*b* is disposed in that region above the holding surface 4*a* different from the overlapping region of the holding surface 4*a* and the polishing pad 20.

In the polishing step S20, the polishing liquid 13 is jetted from the nozzle 26*b* to that region of the GaN wafer 11 held under suction by the holding surface 4*a* which is different from the overlapping region of the GaN wafer 11 and the polishing pad 20.

In the first and second modifications, in the case where the polishing pad 20 is an abrasive grain fixed pad, the polishing liquid 13 does not contain free abrasive grains. However, in the case where the abrasive grains are not fixed in the main body section of the polishing pad 20, the polishing liquid 13 contains free abrasive grains. Other than the above-mentioned points, the structures, methods, and the like according to the above-described embodiment can be varied as required in carrying out the present invention, in such ranges as not to depart from the scope of the object of the invention.

Incidentally, in the above-described first and second experimental examples, verification of the polishing rate in the case of using a polishing liquid 13 that contains dissolved therein permanganate and a water-soluble ionic compound not including nitrate ions but including cerium(IV) ions was not conducted. However, the polishing liquid 13 may contain dissolved therein permanganate and a water-soluble ionic compound not including nitrate ions but including cerium(IV) ions. Such a polishing liquid can be prepared by dissolving the above-mentioned permanganate, ammonium cerium(IV) sulfate, cerium(IV) sulfate, and the like in pure water.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A polishing method for a gallium nitride wafer, comprising:

a holding step of holding a first surface side of the gallium nitride wafer by a holding table; and a polishing step of polishing the gallium nitride wafer while supplying a polishing liquid to an area between a polishing pad and the gallium nitride wafer in a state in which the polishing pad is in contact with a second surface located on a side opposite to the first surface side of the gallium nitride wafer held by the holding table, wherein the polishing liquid contains dissolved therein permanganate and a water-soluble ionic compound including both nitrate ions and cerium (IV) ions, and the weight ratio of the permanganate to the water-soluble ionic compound includes 1:0.15 to 1:0.45.

2. The polishing method for the gallium nitride wafer according to claim 1, wherein the permanganate is sodium permanganate, and the water-soluble ionic compound is diammonium cerium (IV) nitrate.

3. The polishing method for the gallium nitride wafer according to claim 2, wherein the polishing liquid includes between 0.3 wt % and 0.9 wt % diammonium cerium (IV) nitrate.

4. The polishing method for the gallium nitride wafer according to claim 1, wherein the permanganate is sodium permanganate, and the water-soluble ionic compound is cerium (III) nitrate or lanthanum nitrate.

5. The polishing method for the gallium nitride wafer according to claim 4, wherein the polishing liquid includes at least 0.45 wt % cerium (III) nitrate or at least 1.2 wt % lanthanum nitrate.

* * * * *